United States Patent
Matsukawa

(10) Patent No.: US 9,513,459 B2
(45) Date of Patent: Dec. 6, 2016

(54) DRIVING APPARATUS, OPTICAL APPARATUS AND IMAGING APPARATUS

(75) Inventor: Eiji Matsukawa, Yotsukaido (JP)

(73) Assignee: NIKON CORPORATION, Tokyo (JP)

(*) Notice: Subject to any disclaimer, the term of this patent is extended or adjusted under 35 U.S.C. 154(b) by 0 days.

(21) Appl. No.: 14/123,003

(22) PCT Filed: Jul. 5, 2012

(86) PCT No.: PCT/JP2012/004382
§ 371 (c)(1),
(2), (4) Date: Mar. 12, 2014

(87) PCT Pub. No.: WO2013/005442
PCT Pub. Date: Jan. 10, 2013

(65) Prior Publication Data
US 2014/0218814 A1    Aug. 7, 2014

(30) Foreign Application Priority Data

Jul. 5, 2011 (JP) ................. 2011-149082

(51) Int. Cl.
| | |
|---|---|
| *G02B 7/02* | (2006.01) |
| *G02B 15/14* | (2006.01) |
| *G02B 7/04* | (2006.01) |
| *H02N 2/00* | (2006.01) |
| *G02B 7/08* | (2006.01) |
| *H01L 41/09* | (2006.01) |

(52) U.S. Cl.
CPC ............... *G02B 7/04* (2013.01); *G02B 7/023* (2013.01); *G02B 7/08* (2013.01); *H02N 2/004* (2013.01); *H02N 2/0075* (2013.01); *H02N 2/0095* (2013.01); *H01L 41/0913* (2013.01)

(58) Field of Classification Search
CPC ........................................................ G02B 7/08
USPC ............ 359/694–704, 811–824; 310/316.02, 310/323, 32, 17; 396/55, 131
See application file for complete search history.

(56) References Cited

U.S. PATENT DOCUMENTS

| | | | |
|---|---|---|---|
| 7,242,534 B2 | 7/2007 | Kano et al. | ................... 359/694 |
| 8,228,624 B2 * | 7/2012 | Kanda | ..................... G02B 7/08 |
| | | | 359/696 |
| 2007/0070235 A1 * | 3/2007 | Maejima | ................... G02B 7/08 |
| | | | 348/335 |

(Continued)

FOREIGN PATENT DOCUMENTS

| | | |
|---|---|---|
| JP | 4-101679 | 4/1992 |
| JP | 4-212909 | 8/1992 |
| JP | 5-323171 | 12/1993 |

(Continued)

OTHER PUBLICATIONS

International Search Report mailed Sep. 25, 2011 in corresponding International Application No. PCT/JP2012/004382.

(Continued)

*Primary Examiner* — Mohammed Hasan

(57) ABSTRACT

A driving apparatus includes a first axial member that is arranged so as to extend in a predetermined direction, where the predetermined direction is the axial direction of the first axial member, and a driving unit that is configured to generate a first driving force in the axial direction and a second driving force in a direction intersecting the axial direction, where the first and second driving forces are to be applied to the first axial member.

29 Claims, 15 Drawing Sheets

(56) References Cited

U.S. PATENT DOCUMENTS

| | | | |
|---|---|---|---|
| 2010/0226637 A1 | 9/2010 | Kanda et al. | |
| 2014/0233117 A1* | 8/2014 | Togawa | G02B 7/102 359/823 |

FOREIGN PATENT DOCUMENTS

| | | |
|---|---|---|
| JP | 7-104166 | 4/1995 |
| JP | 9-121571 | 5/1997 |
| JP | 2003-528563 | 9/2003 |
| JP | 2004-159425 | 6/2004 |
| JP | 2006-30360 | 2/2006 |
| JP | 2008-268605 | 11/2008 |
| JP | 2010-233443 | 10/2010 |
| WO | WO 01/71899 A2 | 9/2001 |

OTHER PUBLICATIONS

PCT International Preliminary Report on Patentability and Written Opinion of the International Searching Authority mailed Jan. 16, 2014 in corresponding International Application No. PCT/JP2012/004382.

Japanese Office Action issued Apr. 5, 2016 in corresponding Japanese Patent Application No. 2013-522477.

Japanese Office Action issued Jul. 28, 2016 in corresponding Japanese Patent Application No. 2013-522477.

* cited by examiner

| | LINEAR ACTUATOR 1 | LINEAR ACTUATOR 2 | Fg | Tg | MOVEMENT OF AXIAL MEMBER |
|---|---|---|---|---|---|
| (1) | (+) | (+) | Fg1+Fg2 | 0 | TRANSLATION IN AXIAL DIRECTION (+) |
| (2) | (+) | (-) | 0 | Tg1+Tg2 | ROTATION ON AXIS (+) |
| (3) | (-) | (+) | 0 | Tg1+Tg2 | ROTATION ON AXIS (-) |
| (4) | (-) | (-) | Fg1+Fg2 | 0 | TRANSLATION IN AXIAL DIRECTION (-) |

FIG. 7

| | SW= a<br>AXIAL MOVEMENT | SW= b<br>ROTATION |
|---|---|---|
| $\pi/2 \geqq \Delta\theta > 0$ | $+X, \theta_x = 0$ | $X=0, +\theta_x$ |
| $0 > \Delta\theta \geqq -\pi/2$ | $-X, \theta_x = 0$ | $X=0, -\theta_x$ |

FIG.14

DRIVING APPARATUS, OPTICAL APPARATUS AND IMAGING APPARATUS

CROSS-REFERENCE TO RELATED APPLICATIONS

This application claims the benefit, under 35 U.S.C. Section 371, of PCT International Application No. PCT/JP2012/004382, filed Jul. 5, 2012, which claimed priority to Japanese Application No. 2011-149082, filed Jul. 5, 2011, the disclosures of which are hereby incorporated by reference.

BACKGROUND

1. Technical Field

The present invention relates to a driving apparatus, an optical apparatus and an imaging apparatus.

2. Related Art

A driving mechanism uses a pair of guide bars to move, in an axial direction, a component that is desired to be guided. Patent Document 1: Japanese Patent Application Publication No. 07-104166

According to this driving mechanism, an oscillator of an oscillatory wave actuator is configured to be pressed against the component to be driven in order to transmit a driving force from the actuator to the component. Thus, the component to be driven is pressed against one of the guide bars and backlash is removed between the component to be driven and the guide bar. This driving mechanism, however, does not contribute to reduce the backlash between the component to be driven and the other guide bar.

SUMMARY

Therefore, it is an object of an aspect of the innovations herein to provide a driving apparatus, an optical apparatus and an imaging apparatus, which are capable of overcoming the above drawbacks accompanying the related art. The above and other objects can be achieved by combinations described in the claims. A first aspect of the innovations may include a driving apparatus including a first axial member that is arranged so as to extend in a predetermined direction, where the predetermined direction is the axial direction of the first axial member, and a driving unit that is configured to generate a first driving force in the axial direction and a second driving force in a direction intersecting the axial direction, where the first and second driving forces are to be applied to the first axial member.

A second aspect of the innovations may include an optical apparatus including the driving apparatus and a holder that holds a lens and is connected to the first axial member.

A third aspect of the innovations may include an imaging apparatus including the optical apparatus and an imaging unit that is configured to image light entering the imaging apparatus through the optical apparatus.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 7 illustrates an exemplary method of driving the linear actuator 120.

FIG. 14 illustrates an exemplary driving method used by the driving controller 160.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
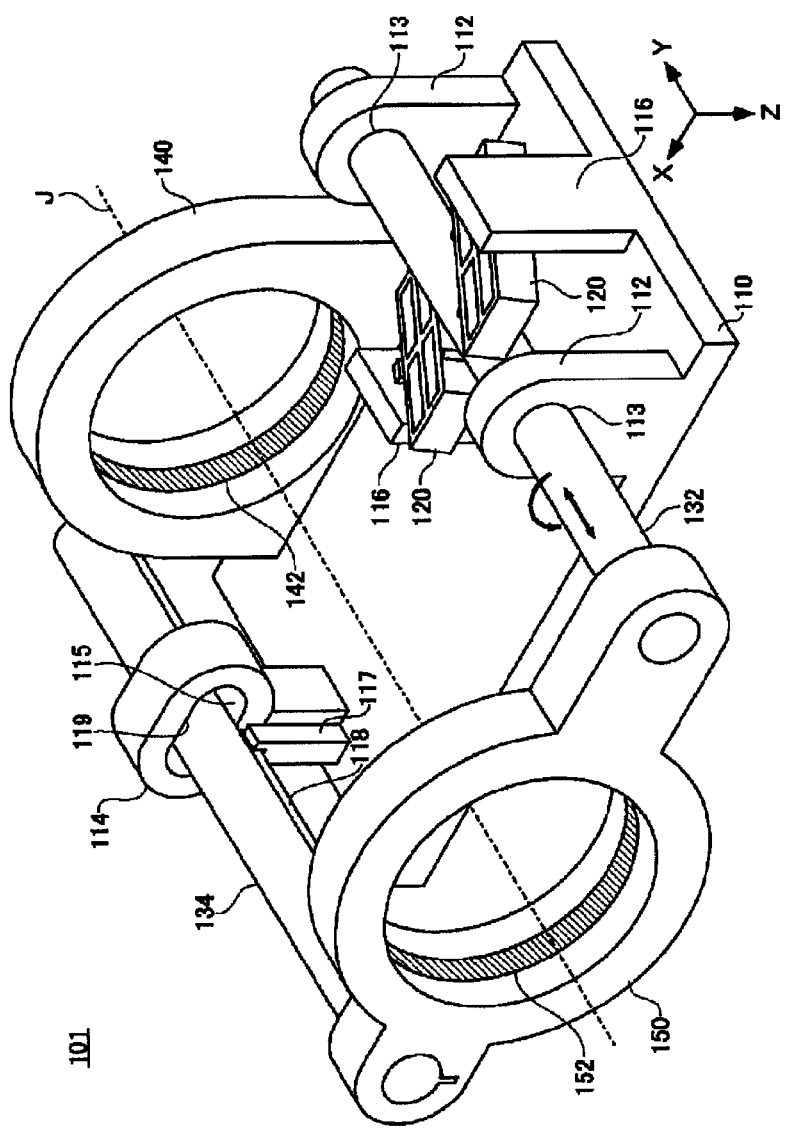
FIG. 1 is a schematic perspective view illustrating a driving apparatus 101.

FIG. 1 is a schematic perspective view illustrating a driving apparatus 101. The driving apparatus 101 includes a base 110, a pair of linear actuators 120 and a stationary lens holder frame 140 that are secured on the base 110, and a pair of axial members 132 and 134 that are movable relative to the base 110. The stationary lens holder frame 140 is configured to hold an optical component including a stationary lens 142 having an optical axis J. The axial members 132 and 134 are arranged so as to extend in an axial direction parallel to the optical axis J.

The base 110 includes a pair of fitting supports 112, a single engagement support 114, and a pair of linear actuator supports 116. The fitting supports 112 each have a fitting hole 113 that has a shape complementary to the cross-sectional shape of the axial member 132 and support the axial member 132 in such a manner that the axial member 132 can slide in the direction parallel to the optical axis J. The inner surface of the engagement support 114 includes an engagement surface 115 (in FIG. 1, the surface relatively closer to the base 110) that abuts the lateral surface of the axial member 134 and an engagement surface 119 (in FIG. 1, the surface relatively further away from the base 110).

The liner actuator supports 116 support the linear actuators 120. The linear actuators 120, which are supported by the linear actuators supports 116, sandwich the axial member 132 therebetween. Since each of the linear actuators 120 is secured onto a corresponding one of the linear actuator supports 116, activation of the linear actuators 120 causes a driving force to be transmitted to the axial member 132 and resultantly allows the axial member 132 to be moved relative to the base 110.

At one end of the axial member 132, a movable lens holder frame 150 is secured. Thus, when the axial member 132 is driven by the linear actuators 120, the movable lens holder frame 150 moves together.

The movable lens holder frame 150 holds therein a movable lens 152. The movable lens 152 shares the optical axis J with the stationary lens 142. In this manner, the stationary lens 142 and the movable lens 152 form an optical system.

The movable lens holder frame 150 is further secured onto one end of the axial member 134. Thus, when the movable lens holder frame 150 moves, the axial member 134 also moves. The axial member 134 is arranged parallel to the axial member 132 and differently positioned than the axial member 132 in the plane that is orthogonal to the optical axis J. In the present embodiment, the axial member 134 is substantially symmetrically positioned to the axial member 132 with respect to the optical axis J. The lateral surface of the axial member 134 abuts the engagement surface 115 or 115b of the engagement support 114. This prevents the movable lens holder frame 150 from rotating around the axial member 132.

A position detector 117 is coupled to the base 110 or engagement support 114 and uses a slit member 118, which is integrated with the axial member 134, to detect the position of the axial member 134 in the direction in which the optical axis J extends and the position of the axial member 134 in the vertical direction (Z direction) in FIG. 1. The position detector 117 and the slit member 118 will be described in detail later.

Figure 2:
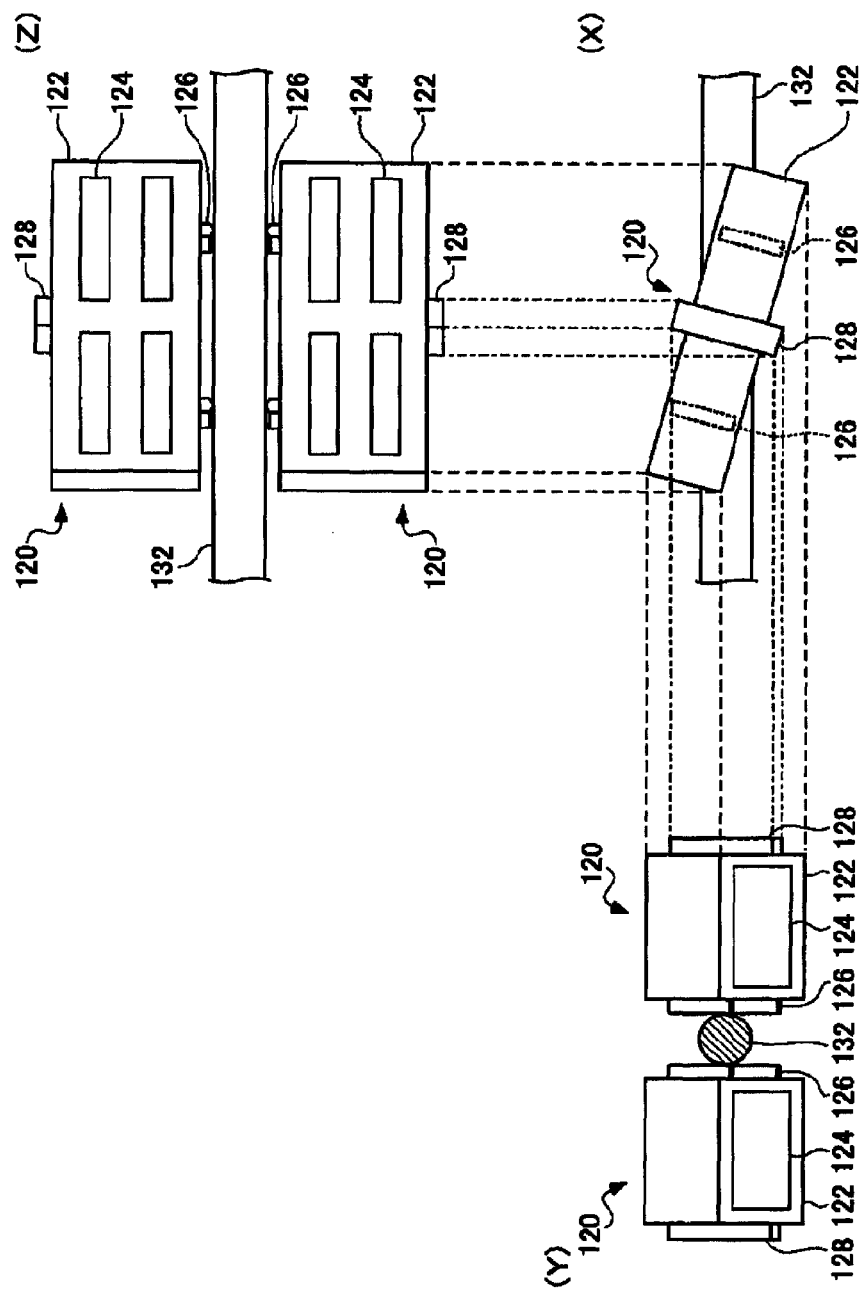
FIG. 2 is a schematic view illustrating how linear actuators 120 are arranged.

FIG. 2 is a schematic view illustrating how the pair of linear actuators 120 and the axial member 132 are positioned relative to each other in the driving apparatus 101. In FIG. 2, the reference marks X, Y and Z in the parentheses represent the directions in which the linear actuators 120 are seen.

The linear actuators 120, which are piezoelectric actuators, each have an oscillator 122, electrodes 124, contacts 126, and a pressurizing unit 128. The oscillator 122 is formed by a piezoelectric material such as PZT.

The electrodes 124 are distributed on the front surface of the oscillator 122. The electrodes 124 are also distributed on the back surface of the oscillator 122. The electrodes 124 are formed by a metal layer printed onto the surfaces of the oscillator 122, receive an driving voltage applied from an external source and generate an electric field that is to act on the oscillator 122.

The contacts 126 are provided on part of the end surface of the oscillator 122 and abut the axial member 132. One pair of contacts 126 is provided for each linear actuator 120. When the oscillator 122 oscillates, the contacts 126 also oscillate and the movement of the contacts 126 are transmitted to and serve as a driving force for the axial member 132. The contacts 126 are formed by a resin material containing potassium titanate, which is highly wear-resistant (for example, Poticon®).

The hardness of the base material of the axial member 132 is preferably equal to or higher than the hardness of the contacts 126. This is effective in order to prevent the axial member 132 from being damaged by the oscillation during the driving. In addition, when the hardness of the contacts 126 is equal to or lower than the hardness of the base material of the axial member 132, the contacts 126 can be more absorptive for the impact caused by disturbance and thus achieve improved impact-resistance while the axial member 132 is being held by the contacts 126.

The surface of the axial member 132 is preferably located higher than (preferably has higher hardness than) the base material of the axial member 132. This enables the axial member 132 to be more resistant against wearing that may be caused by its sliding against the contacts 126. In light of these, the base material of the axial member 132 may be SUS304 or stainless steel and the front surface of the axial member 132 may be subjected to nitriding process to be formed into a hardened film, for example.

The pressurizing unit 128 is elastic and positioned in a compressed state between the linear actuator support 116 shown in FIG. 1 and the oscillator 122. In this manner, the oscillators 122 is biased so that the contacts 126 are pressed against the axial member 132. Furthermore, the pressurizing unit 128 abuts the oscillator 122 at a position in the vicinity of the middle of the oscillator 122 in its longitudinal direction.

The linear actuators 120 may be each formed by stacking thin-plate-like oscillators 122 each of which has the electrodes 124. This enables the oscillators 122 to oscillate efficiently with a relatively low voltage.

The pair of linear actuators 120 described above are arranged parallel to each other with the axial member 132 being sandwiched therebetween. The pair of linear actuators 120 are at angle with respect to the Y axis in the Y-Z plane shown in FIG. 1. Therefore, the linear actuators 120 each generate a driving force containing a component in the axial direction of the axial member 132 and a component in the circumferential direction of the axial member 132.

In other words, the pair of linear actuators 120 are arranged in such a manner that the driving force is generated by the linear actuators 120 in the direction at an angle with respect to the Y axis (the axial direction of the axial member 132) shown in FIG. 1. The angle formed between the Y axis and the driving force preferably falls within the range from 5° to 10°. The linear actuators 120 are arranged so that the driving forces are generated by the respective linear actuators 120 in parallel directions.

Figure 3:
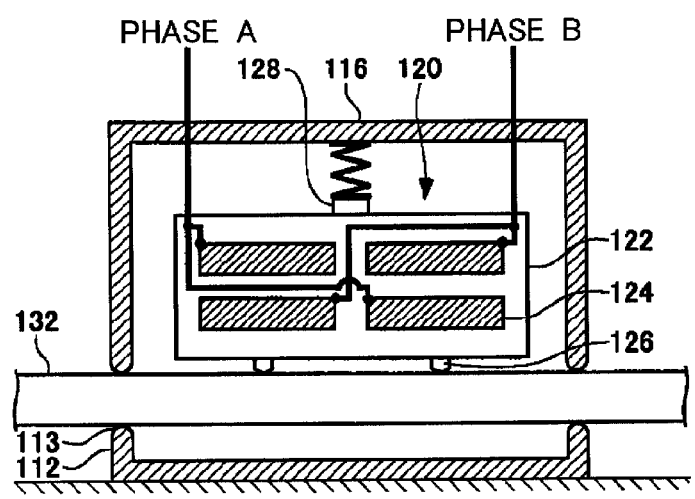
FIG. 3 is a schematic view illustrating a single linear actuator 120.

FIG. 3 is a schematic view illustrating a single linear actuator 120 alone. Here, it is assumed that the linear actuator 120 is arranged parallel to the axial member 132.

As shown in FIG. 3, the electrodes 124 are formed by dividing the surface of the oscillator 122 into two sections in both the axial direction of the axial member 132 and the direction orthogonal to the axial direction. In total, two pairs of electrodes 124 are formed on the surface of the oscillator 122.

Here, a common driving voltage is applied to the two electrodes 124 diagonally arranged on the oscillator 122. Therefore, Phase A driving voltage and Phase B driving voltage, in other words, two driving voltages having different phases are applied to the linear actuator 120 having the four electrodes 124.

Figure 4:
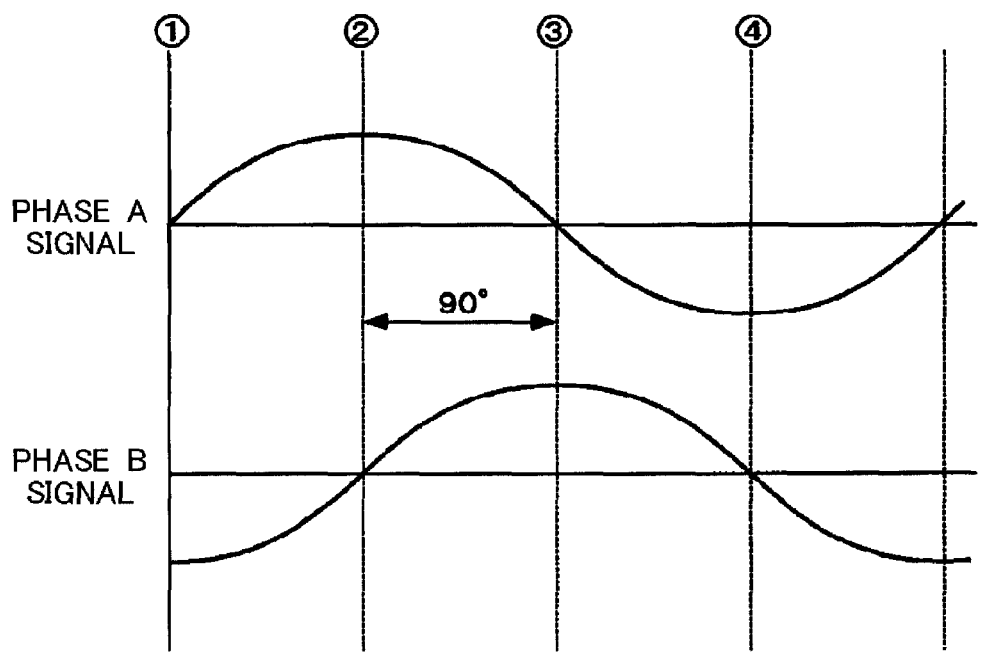
FIG. 4 is a graph illustrating an example of a driving signal for the linear actuator 120.

FIG. 4 is a graph illustrating exemplary driving signals for the linear actuator 120. As shown in FIG. 4, Phase A and Phase B driving voltages applied to the electrodes 124 have sinusoidal waveforms whose phases are 90 degreed apart from each other.

In this manner, the region of the oscillator 122, which is made of a piezoelectric material, that has therein the electrodes 124 applied with the Phase A driving voltage expands and shrinks at different timings from the region of the oscillator 122 that has therein the electrodes 124 applied with the Phase B driving voltage. In the following description, the region of the oscillator 122 that is applied with the Phase A single will be referred to as a Phase A region and the region of the oscillator 122 that is applied with the Phase B signal will be referred to as a Phase B region.

Figure 5:
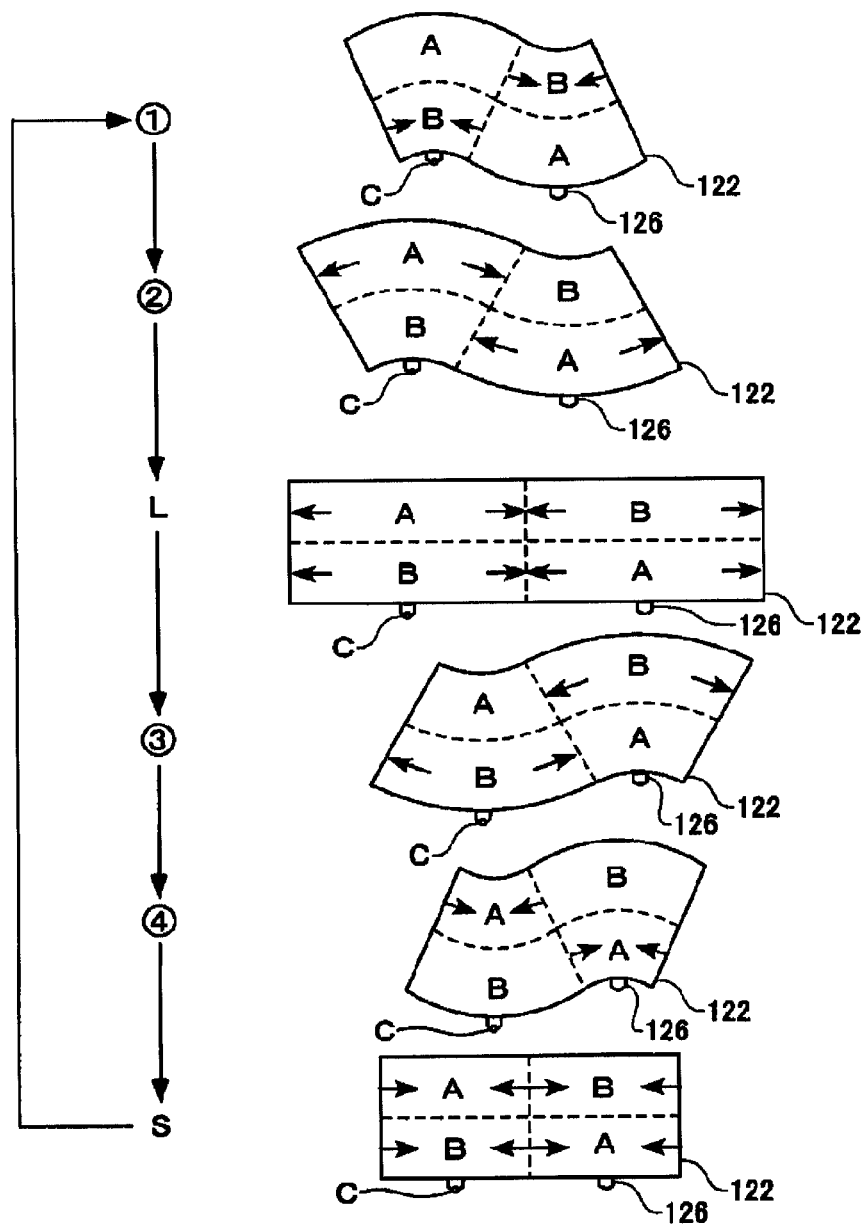
FIG. 5 is a schematic view illustrating how the linear actuator 120 moves.

FIG. 5 is a schematic view illustrating a single cycle of movements of the linear actuator 120 that are caused by application of the driving voltages shown in FIG. 4. The numbers in the circles in FIG. 5 correspond to the numbers in the circles in FIG. 4. In FIG. 5, the contact point C at which the contact 126 comes into contact with the axial member 132 is shown.

At a timing 1 (represented by "1" enclosed in the circle in FIGS. 4 and 5), the voltage of the Phase A signal is zero and the voltage of the Phase B signal is negative. In the oscillator 122, each Phase A region neither expands nor shrinks, but each Phase B region shrinks. Accordingly, the oscillator 122 bends in such a manner that each Phase B region retreats inside. When the oscillator 122 deforms in this manner, the contact point C also moves.

Subsequently, at a timing 2 (represented by "2" enclosed in the circle in FIGS. 4 and 5), the Phase A signal has a positive voltage and the voltage of the Phase B signal is zero. In the oscillator 122, each Phase A region expands, and each Phase B region neither expands nor shrinks. Accordingly, the oscillator 122 remains bended in such a manner that each Phase B region retreats inside, and the entire oscillator 122 expands when compared to its state at the timing 1. When the oscillator 122 deforms in this manner, the contact point C also moves.

After this, both of the Phase A signal and the Phase B signal have positive voltages and the entire oscillator 122 expands without bending for a time period L. After the time period L, a timing 3 (represented by "3" enclosed in the circle in FIGS. 4 and 5) comes. During the time period L, as the oscillator 122 expands, the contact point C moves.

At the timing 3, the voltage of the Phase A signal is zero and the Phase B signal has a positive voltage. In the oscillator 122, each Phase A region neither expands nor shrinks, and each Phase B region expands. Accordingly, the oscillator 122 bends in such a manner that each Phase A region retreats inside, but the entire oscillator 122 expands when compared with its state observed at the timing 1 and shrinks when compared with its state observed during the time period L. When the oscillator 122 deforms in this manner, the contact point C also moves.

At the subsequent timing 4 (represented by "4" enclosed in the circle in FIGS. 4 and 5), the Phase A signal has a negative voltage and the voltage of the Phase B signal is zero. In the oscillator 122, each Phase A region shrinks and each Phase B region neither expands nor shrinks. Accordingly, the oscillator 122 bends in such a manner that the Phase A regions retreat inside. The entire length of the oscillator 122 is shorter at the timing 4 than at the timing 3. When the oscillator 122 deforms in this manner, the contact point C also moves.

After this, both of the Phase A signal and the Phase B signal have negative voltages and the entire oscillator 122 shrinks without bending for a time period S. After the time period S, the Phase A signal and the Phase B signal regain the same states as those at the timing 1. The oscillator 122 repeatedly goes through the cycle of movements observed at the timings 1 to 4 by being supplied with the periodic Phase A and Phase B driving signals.

Figure 6:
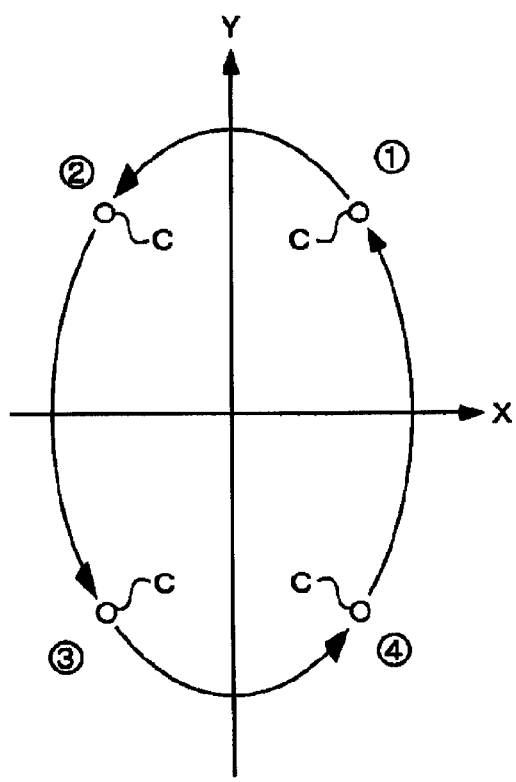
FIG. 6 is a schematic view illustrating how the linear actuator 120 works.

FIG. 6 is a schematic view illustrating how the linear actuator 120 works. The numbers enclosed in the circles in FIG. 6 correspond to the numbers enclosed in the circles in FIGS. 4 and 5.

As shown in FIG. 6, the contact point C moves in an ellipsoidal trajectory as the oscillator 122 goes through the series of movements observed at the timings 1 to 4. Accordingly, in the time period from the timing 3 to the timing 4, a driving force is applied from the contacts 126 to the axial member 132, which is in contact with the contacts 126 at the contact point C.

Note that, however, the linear actuators 120 are at angle with respect to the axial direction of the axial member 132 in the driving apparatus 101, as described above with reference to FIGS. 1 and 2. Therefore, the linear actuators 120 each generate concurrently an axial thrust force $F_g$(N) that serves to translate the axial member 132 in the longitudinal direction and an axial rotational torque $T_g$(Nm) that serves to rotate the axial member 132 around the longitudinal rotation axis, as represented by the following Expression 1.

$$F_g = \pm \mu_g \cdot F_c \cdot \cos\psi \\ T_g = \pm \frac{d}{2} \cdot \mu_g \cdot F_c \cdot \sin\psi \qquad \text{Expression 1}$$

In Expression 1, "$\psi$" denotes the gradient of the driving force generated by the linear actuator 120 with respect to the axial member 132 (in units of "rad"), "$\mu_g$" denotes the dynamic friction coefficient between the contacts 126 and the surface of the axial member 132 (no units), "$F_C$" denotes the pressurizing force generated by the pressurizing unit 128 (in units of N), and "d" denotes the diameter of the axial member 132 (in units of mm).

According to Expression 1, the signs of the right-side values are reversed when the phases of the Phase A and Phase B driving signals applied to the linear actuator 120 are shifted by 180°, in other words, when the positive and negative polarities of the driving signals are reversed. Therefore, the axial thrust force $F_g$ and the axial rotational torque $T_g$ generated by each of the linear actuators 120 can be independently reversed.

FIG. 7 illustrates an exemplary method of driving the linear actuator 120 and how differently the axial member 132 moves as the positive and negative polarities of the driving signals are controlled as described above. When the axial thrust force $F_{g1}$ and axial rotational torque $T_{g1}$ generated by one of the linear actuators 120 are distinguished from the axial thrust force $F_{g2}$ and axial rotational torque $T_{g2}$ generated by the other of the linear actuators 120, different driving signals may be supplied to the linear actuators 120 as shown in FIG. 7 to change the driving directions, so that the axial member 132 can be translated or rotated in a desired direction.

Specifically speaking, when the linear actuators 120 generate the axial thrust forces $F_{g1}$ and $F_{g2}$ in the same direction, the axial member 132 is translated by being driven by the sum of the axial thrust forces $F_{g1}$ and $F_{g2}$ generated by the linear actuators 120. On the other hand, when the linear actuators 120 generate the axial thrust forces $F_{g1}$ and $F_{g2}$ in opposite directions, the axial thrust forces $F_{g1}$ and $F_{g2}$ that act on the axial member 132 cancel each other so that the axial member 132 is not translated.

Likewise, when the linear actuators 120 generate the axial rotational torques $T_{g1}$ and $T_{g2}$ in the same direction, the axial member 132 is rotated by being driven by the sum of the axial rotational torques $T_{g1}$ and $T_{g2}$ generated by the linear actuators 120. On the other hand, when the linear actuators 120 generate the axial rotational torques $T_{g1}$ and $T_{g2}$ in opposite directions, the axial rotational torques $T_{g1}$ and $T_{g2}$ that act on the axial member 132 cancel each other so that the axial member 132 is not rotated.

As described above, having the pair of linear actuators 120, the driving apparatus 101 allows the axial member 132 to be translated in the axial direction and to rotate as well. Thus, in the driving apparatus 101 shown in FIG. 1, the translation of the axial member 132 in the axial direction enables the movable lens 152 to translate in the direction of the optical axis J. In addition, the rotation of the axial member 132 enables the axial member 134 to be pressed against the engagement surface 115 or 115b, thereby removing a backlash.

Here, there is a backlash between the axial member 134 and the engagement support 114. For example, when the axial member 134 is in contact with the engagement surface 115, the axial member 134 is not in contact with the engagement surface 119. In other words, the backlash may cause the axial member 134 to move within the space defined between the engagement surface 115 and the engagement surface 119.

When the movable lens 152 comes to rest, the position of the movable lens 152 may vary within the plane perpendicular to the optical axis J depending on the varying position of the axial member 134 within the range of the backlash. In this manner, the backlash affects the optical performance.

The backlash between the axial member 134 and the engagement support 114 may include a backlash in the X direction in FIG. 1 (the backlash in the direction intersecting the above-mentioned backlash). However, the backlash in the X direction is removed by sandwiching the axial member 132 between the linear actuators 120 in the X direction. Alternatively, a single linear actuator 120, which abuts the axial member 132 and which is at angle with respect to the axial member 132, may cause the axial member 132 to rotate and translate concurrently, so that the backlash is removed.

The control method shown in FIG. 7 supposes that the phase difference between the Phase A signal and the Phase B signal is the same between the driving signals applied to the respective linear actuators 120, the axial thrust forces $F_{g1}$ and $F_{g2}$ are the same, and the axial rotation torques $T_{g1}$ and $T_{g2}$ are the same. However, when the phase difference between the Phase A signal and the Phase B signal is different between the respective linear actuators 120, the axial thrust forces $F_{g1}$ and $F_{g2}$ are different, and the axial rotation torques $T_{g1}$ and $T_{g2}$ are different.

Here, $v_1$ and $v_2$ respectively represent the velocities of the linear actuators 120 while the contacts 126 are in contact with the axial member 132. Since the linear actuators 120 form an angle $\psi$ (rad) with respect to the axial member 132, the axial velocities $v_{g1}$ and $v_{g2}$ and the angular velocities $\omega_{g1}$ and $\omega_{g2}$ in the circumferential direction provided from the linear actuators 120 to the axial member 132 can be represented by the following Expression 2.

$$\left. \begin{array}{l} v_{g1} = v_1 \cdot \cos\psi_1 \cdot \omega_{g1} = \dfrac{2v_1}{d} \cdot \sin\psi_1 \\ v_{g2} = v_2 \cdot \cos\psi_2 \cdot \omega_{g2} = -\dfrac{2v_2}{d} \cdot \sin\psi_2 \end{array} \right\} \quad \text{Expression 2}$$

When it is assumed that no other forces act on the axial member 132 than the forces applied from the pair of linear actuators 120, the workloads of the linear actuators 120 should balance. Therefore, the above Expression 2 can be transformed into the following Expression 3.

$$\left. \begin{array}{l} \mu_{g1} \cdot F_{c1} \cos\psi_1 \cdot (V_g - v_{g1}) + \\ \mu_{g2} \cdot F_{c2} \cos\psi_2 \cdot (V_g - v_{g2}) = 0 \\ \dfrac{d}{2} \cdot \mu_{g1} \cdot F_{c1} \cdot \sin\psi_1 \cdot (\omega_g - \omega_{g1}) - \\ \dfrac{d}{2} \cdot \mu_{g2} \cdot F_{c2} \cdot \sin\psi_2 \cdot (\omega_g - \omega_{g2}) = 0 \end{array} \right\} \quad \text{Expression 3}$$

In Expression 3, "Vg" denotes the axial velocity of the axial member 132 driven by the pair of linear actuators 120, and "$\omega$g" denotes the axial angular velocity of the axial member 132 driven by the pair of linear actuators 120.

Here, it is assumed that the dynamic friction coefficients $\mu_{g1}$ and $\mu_{g2}$ are the same, the pressurizing forces $F_{C1}$ and $F_{C2}$ are the same, and the gradients $\psi_1$ and $\psi_2$ are the same as shown in the following Expression 4.

$$\left. \begin{array}{l} \mu_{g1} = \mu_{g2} \\ F_{c1} = F_{c2} \\ \psi_1 = \psi_2 \end{array} \right\} \quad \text{Expression 4}$$

Considering the above relations, Expression 3 can be transformed into Expression 5.

$$\left. \begin{array}{l} V_g = (v_{g1} + v_{g2})/2 \\ \omega_g = (\omega_{g1} + \omega_{g2})/2 \end{array} \right\} \quad \text{Expression 5}$$

Expression 5 indicates that controlling the velocities $v_1$ and $v_2$ can result in controlling the axial velocity $V_g$ and the angular velocity $\omega_g$ of the axial member 132 driven by the pair of linear actuators 120. The velocities $v_g$ at the contacts 126 of the linear actuators 120 are proportional to the driving frequency f and the amplitude $A_X$ in the X direction of the ellipsoidal motion of the contacts C shown in FIG. 6. In other words, when the driving frequency is constant, the velocities $v_g$ at the contacts 126 can vary by varying the amplitude AX.

With reference to FIGS. 4 and 5 again, an increase in the phase difference between the Phase A signal and the Phase B signal from 90 degrees, which is shown in the drawings, may result in an increase in the vertical amplitude $A_Y$ of the ellipsoidal motion of the contact C and a decrease in the horizontal amplitude AX. Furthermore, an increase in the phase difference between the Phase A signal and the Phase B signal from 90 degrees, which is shown in the drawings, may result in a decrease in the vertical amplitude $A_Y$ of the ellipsoidal motion of the contact C and an increase in the horizontal amplitude AX.

Figure 8:
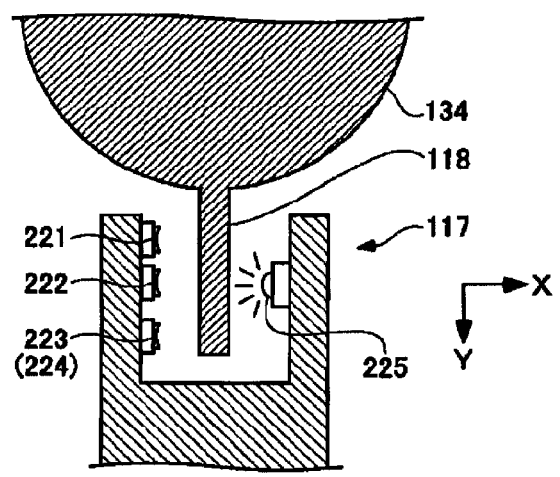
FIG. 8 illustrates how a position detector 117 is configured and operates.

FIGS. 8 to 12 illustrate the configuration and function of the position detector 117 shown in FIG. 1. FIG. 8 shows the position detector 117 seen in the axial direction of the axial member. The position detector 117 has optical sensors 221, 222, 223, 224 and a light emitter 225.

Here, the axial member 134 has the slit member 118. The light emitter 225 is positioned at the opposite side, with respect to the slit member 118, to the optical sensors 221, 222, 223 and 224.

Figure 9:
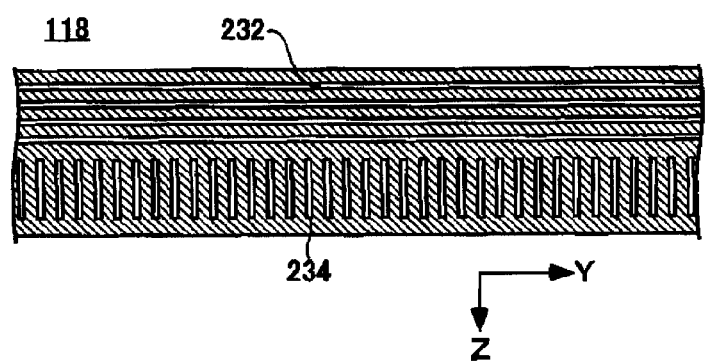
FIG. 9 is a side view illustrating a slit member 118.

FIG. 9 shows the slit member 118 seen in the X direction of FIG. 8. The flat-plate-like slit member 118 has a plurality of slits 232 that are parallel to each other, arranged at equal intervals along the axial direction (the Y direction) of the axial member 134 and a plurality of slits 234 that are parallel to each other, arranged at equal intervals along the direction intersecting the axial direction of the axial member 134 (the Z direction, the direction intersecting the slits 232).

With the above-described configuration, the light emitted from the light emitter 225 only partially transmits through the slits 232 of the slit member, and the transmitted light is received by the pair of optical sensors 221 and 222. In addition, the light emitted from the light emitter 225 only partially transmits through the slits 234, and the transmitted light is received by the pair of optical sensors 223 and 224.

Figure 10:
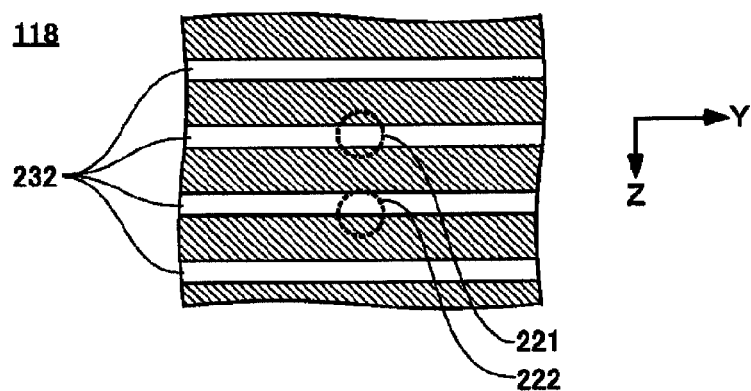
FIG. 10 is a partially enlarged view of a slit 232.

FIG. 10 shows how the optical sensors 221 and 222 are arranged relative to the slits 232. As shown in FIG. 10, the optical sensors 221 and 222 are positioned in such a manner that, when the optical sensor 221 is positioned so as to receive the light through one slit on the entire surface, the other optical sensor 222 is positioned so as to receive the light through an adjacent slit on part of the surface.

Figure 11:
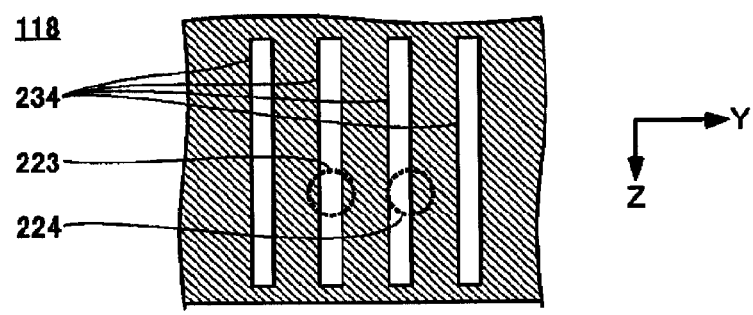
FIG. 11 is a partially enlarged view of a slit 234.

FIG. 11 likewise shows how the optical sensors 223 and 224 are arranged relative to the slits 234. As shown in FIG. 11, the optical sensors 223 and 224 are positioned in such a manner that, when the optical sensor 223 is positioned so as to receive the light through one slit on the entire surface, the other optical sensor 224 is positioned so as to receive the light through an adjacent slit on part of the surface. The respective optical sensors 221, 222, 223 and 224 output electrical signals according to the amounts of the light received at their surfaces.

Figure 12:
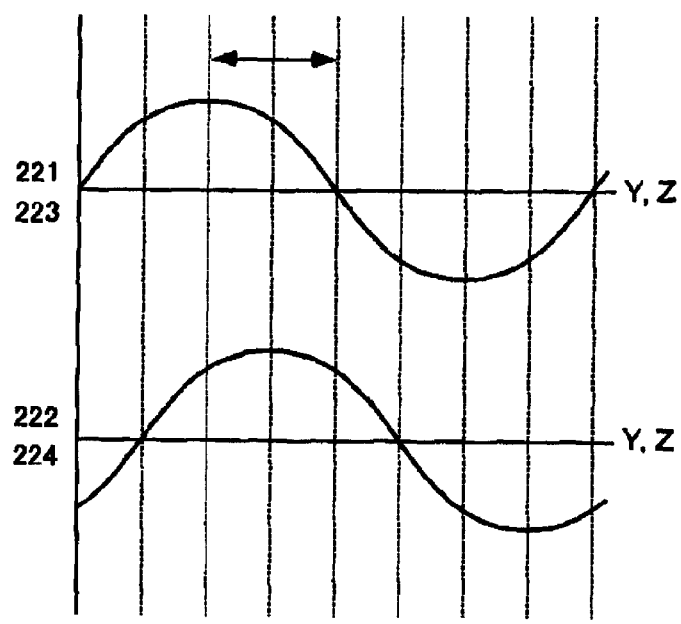
FIG. 12 is a graph illustrating how the position detector 117 operates.

FIG. 12 shows how the output signals from the respective optical sensors vary as the slit member 118 moves. In other words, FIG. 12 shows how the output signals from the optical sensors 221 and 222 vary as the slit member 118 moves in the direction (the Z direction) perpendicular to the axial direction of the axial member 134 and how the output signals from the optical sensors 223 and 224 change as the slit member 118 moves in the axial direction (the Y direction) of the axial member 134.

Referring to FIG. 12, the output signals from the respective pairs of optical sensors likewise vary in a sinusoidal manner as the slit member 118 moves, but there is a difference in phase between the output signals. This is because the optical sensors are positioned as described in FIGS. 10 and 11.

The difference in level at a given point of time between the two signal waveforms shown in FIG. 12 can tell the position (in the axial direction and the direction perpendicular to the axial direction) of the slit member 118 (in other words, the axial member 134). The variation in the levels of the signal waveforms along the time axis can tell the amount of the movement (in the axial direction and the direction perpendicular to the axial direction) of the slit member 118 (in other words, the axial member 134).

The above-described position detector 117 is connected to a lens controller 250, described later. Thus, the lens controller 250 can learn where the axial member 134 is positioned and how much the axial member 134 has moved based on the signals from the optical sensors. The above exemplary embodiment of the position detector 117 uses the slit member 118, but the position detector 118 can also be configured using a reflective linear scale and the like, in place of the slit member 118. Furthermore, the rotational position of the axial member 132 can be detected by providing a rotary scale on the axial member 132. In addition, the position detector 117 can be configured using other sensors than the optical sensors, for example, using cyclically magnetized magnetic scales and magnetic sensors.

Figure 13:
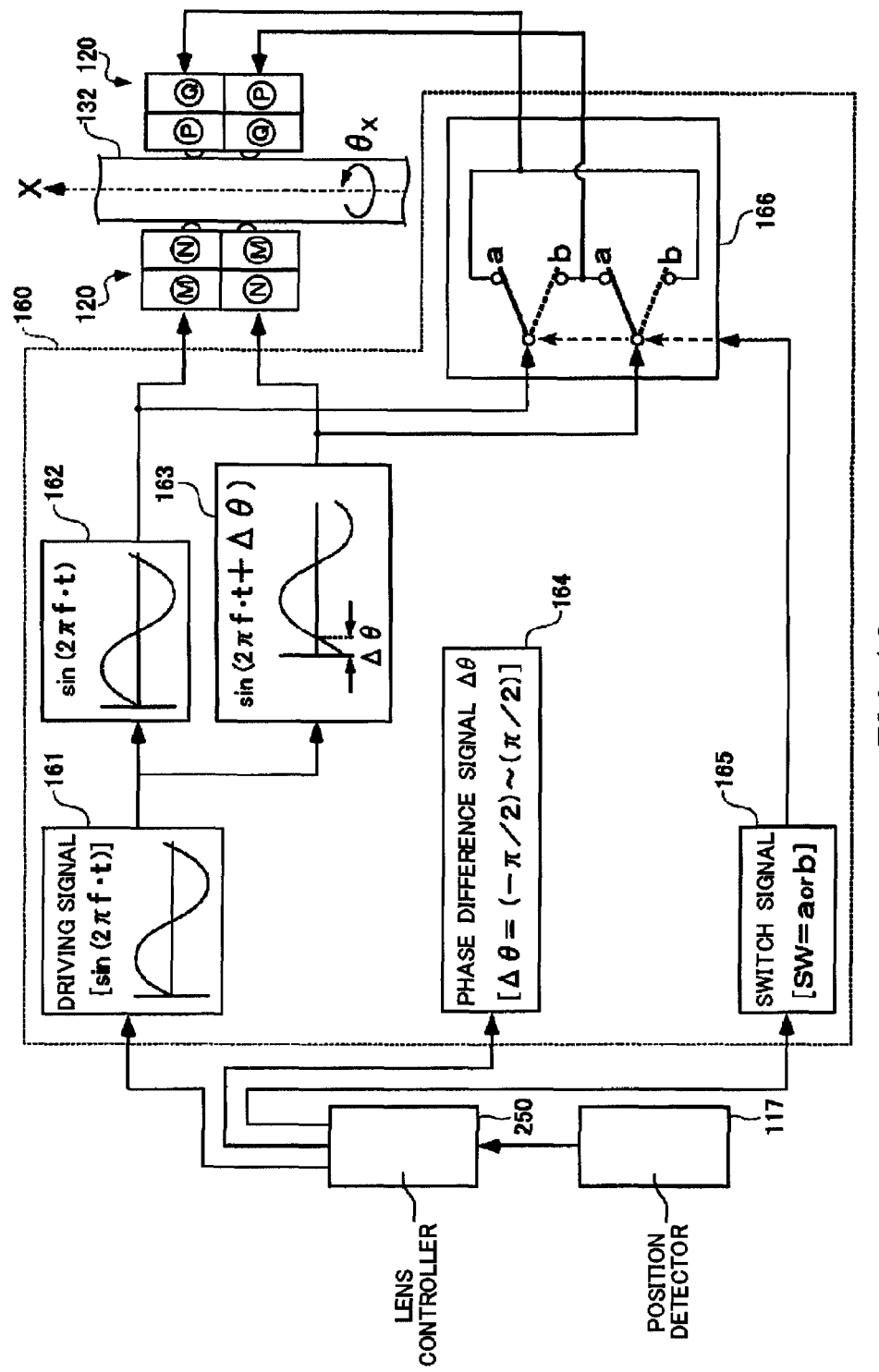
FIG. 13 is a block diagram illustrating a driving controller 160.

FIG. 13 is a block diagram illustrating a driving controller 160 that is configured to supply driving voltages to the linear actuators 120 while performing the above-described control. The driving controller 160 includes a driving signal generator 161, driving voltage generators 162 and 163, a phase difference signal controller 164, a switch controller 165, and a switch 166. The driving controller 160 is provided in the vicinity of the driving apparatus 101 shown in FIG. 1. The operation of the driving controller 160 is controlled by the lens controller 250.

When the movable lens 152 is driven (for focusing, changing the magnification and the like), the lens controller 250 outputs instruction signals to the driving signal generator 161, the phase difference signal controller 164, and the switch controller 165. In response to these instruction signals, the driving controller 160 performs the following control.

The driving signal generator 161 generates a sinusoidal wave having a constant amplitude and determines the driving frequency for the driving signals to be supplied to the driving apparatus 101. The driving voltage generators 162 and 163 respectively generate driving voltages that vary according to the driving signal supplied from the driving signal generator 161.

The driving voltage generator 162 generates a driving voltage that has the same phase as the driving signal supplied from the driving signal generator 161. The driving voltage generator 163 generates a driving voltage that has a phase difference $\Delta\theta$ with respect to the driving signal. The phase difference $\Delta\theta$ varies according to the magnitude of the phase difference $\Delta\theta$ indicated by the phase difference signal supplied from the phase difference signal controller 164. The phase difference signal controller 164 generates a phase difference signal $\Delta\theta$ indicating a phase difference ranging from $-\pi/2$ to $\pi/2$. Thus, the driving voltages output from the driving voltage generators 162 and 163 have a phase difference therebetween ranging from $-\pi/2$ to $\pi/2$.

The driving voltages output from the driving voltage generators 162 and 163 are applied to the linear actuators 120 as the Phase A driving voltage and the Phase B driving voltage. Here, the electrodes M and N of one of the linear actuators 120 directly receive the driving voltage output from the driving voltage generator 162. The electrodes P and Q of the other linear actuator 120 receive the driving voltage via the switch 166.

The switch 166 receives a switching signal from the switch controller 165 and switches the connections between the electrodes P and Q of the linear actuator 120 and the Phase A driving voltage and the Phase B driving voltage. In this manner, the driving voltages applied to the linear actuator 120 including the electrode P and Q are in or out of phase with respect to the driving voltages applied to the linear actuator 120 including the electrodes M and N.

As described above, the driving controller 160 includes the driving signal generator 161 that is configured to generate a driving signal that is shared between the pair of linear actuators 120. Thus, the driving controller 160 can achieve a small circuit even if it is configured to drive a plurality of linear actuators 120, which contributes to reduce the size of the driving apparatus 101.

The driving controller 160 can determine the driving frequency by controlling the driving signal generator 161. Furthermore, the driving controller 160 can change the phase difference between the Phase A driving signal and the Phase B driving signal by controlling the phase difference signal controller 164. In addition, the driving controller 160 can control the linear actuators 120 to operation in or out of phase relative to each other by controlling the switch controller 165.

FIG. 14 illustrates an exemplary method of how the driving controller 160 drives the linear actuators 120. As shown in FIG. 14, the axial member 132 moves differently depending on whether the value of the phase difference signal Δ generated by the phase difference signal controller 164 in the driving controller 160 is positive or negative. In addition, the axial member 132 moves differently depending on whether the switch 166 in the driving controller 160 is connected to the a side or to the b side.

By combining these variables, the driving apparatus 101 can translate and rotate the axial member 132 bi-directionally. Furthermore, by controlling the value of the phase difference signal in the range from 0 to π/2 or from −π/2 to 0, the driving apparatus 101 can vary the moving velocity of the axial member 132. The axial member 132 moves in the manner shown in FIG. 7 depending on the state of the switch 166.

Consequently, the driving apparatus 101 can change the amplitudes $A_X$ and $A_Y$ for the contacts 126 by changing the phase difference between the Phase A signal and the Phase B signal for each of the linear actuators 120. Furthermore, the driving apparatus 101 can change the velocities $v_{g1}$ and $v_{g2}$ achieved by the linear actuators 120 by changing the amplitude for the contacts 126, thereby changing the velocity $v_g$ of the axial translation of the axial member 132 or the angular velocity $\omega_g$ of the rotation of the axial member 132.

This means that the axial member 132 may be driven according to the difference in workload between the linear actuators 120. In the driving apparatus 101, the linear actuators 120 are arranged parallel to each other. This facilitates the control of the linear actuators 120 since similar driving forces may be generated irrespective of whether they rotate in the same or different directions. Even when the linear actuators 120 have different gradients with respect to the axial member 132, the axial member 132 is still driven according to the difference in workload between the linear actuators 120.

In the above-described example, the stationary linear actuators 120 drive the axial member 132, so that the movable lens holder frame 150 fixed onto the axial member 132 is moved. However, the driving apparatus 101 may alternatively be configured such that the movable lens holder frame 150 having the linear actuators 120 mounted thereon is moved with respect to the fixed axial members 132 and 134.

In the above-described example, the linear actuators 120 are piezoelectric actuators. However, the linear actuators 120 are not limited to piezoelectric actuators, but may be other types of linear actuators using, for example, electromagnetic force.

In the above-described example, the linear actuators 120 are positioned so as to oppose each other with the axial member 132 sandwiched therebetween. However, the linear actuators 120 may only need to be positioned so as to sandwich at least partially the axial member 132.

The following describes how the linear actuators 120 control the driving of the movable lens 152. In particular, the following describes four different methods of how the linear actuators 120 control the driving.

In any of the driving control methods, the linear actuators 120 do not operate and keep biased against the axial member 132 due to their self position keep capabilities while not applied with the driving voltages. Therefore, the axial member 134 does not move in the axial direction, does not rotate around the axial direction and thus keeps stationary unless external disturbance such as an impact is applied.

The lens controller 250 outputs instruction signals to the driving signal generator 161, the phase difference signal controller 164, and the switch controller 165 when it starts the driving of the movable lens 152.

(1) First Driving Control Method

To begin with, the lens controller 250 controls the driving force to drive the axial member 132 in the axial direction. The lens controller 250 instructs the driving signal generator 161 to generate a driving signal and instructs the phase difference signal controller 164 to generate a phase difference signal indicative of, for example, 90 degrees (or −90 degrees) depending on which direction the axial member 132 is to be driven. The lens controller 250 then instructs the switch controller 165 to connect the switch 166 to the a side. As a result, the axial member 132 is driven in the axial direction, and the axial member 134 is also moved in the axial direction.

The lens controller 250 receives the signals from the position detector 117 and monitors the distance by which the axial member 134 moves in the axial direction, based on the signals from the optical sensors 223 and 224. Once the lens controller 250 detects that the axial member 134 has moved to a target position, the lens controller 250 outputs an instruction signal to prevent the driving signal generator 161 from generating the driving signal.

After this, the lens controller 250 uses the signals from the optical sensors 221 and 222 of the position detector 117 to detect the position of the axial member 134 in terms of the direction perpendicular to the axial direction (the Z direction). The lens controller 250 stores therein in advance the position of the axial member 134 at which the axial member 134 comes into contact with the engagement surface 115 and the position of the axial member 134 at which the axial member 134 comes into contact with the engagement surface 115*b*.

After this, the lens controller 250 controls the driving force to rotate the axial member 132. The lens controller 250 instructs the driving signal generator 161 to generate a driving signal and instructs the phase difference signal controller 164 to generate a phase difference signal indicative of, for example, 90 degrees (or −90 degrees) depending on the direction in which the axial member 132 is to be driven. The lens controller 250 also instructs the switch controller 165 to connect the switch 166 to the b side. Here, the axial member 134 is brought into contact with the engagement surface 115 to remove the backlash.

The above-described control allows the axial member 132 to rotate around the axis. As a result, the axial member 134 moves in the direction intersecting the axial direction, for example, in the vertical direction. The lens controller 250 uses the signals from the optical sensors 221 and 222 of the position detector 117 to monitor the position of the axial member 134 in the direction perpendicular to the axial direction. Once the lens controller 250 detects that the axial member 134 has moved to the prestored position at which the axial member 134 is in contact with the engagement surface 115, the lens controller 250 outputs an instruction signal to prevent the driving signal generator 161 from generating the driving signal.

In the above-described manner, the axial member 132 is driven to move in the axial direction and to rotate, so that the movable lens 152 is moved to a predetermined position along the optical axis and the axial member 134 can be moved to remove the backlash. Thus, the lens controller 250 may allow the linear actuators 120 to selectively generate one of the driving force that realizes the movement in the axial direction and the driving force to realize the rotation.

According to the above driving control, the axial member 134 is controlled to come into contact with the engagement surface 115. This is because the optical system is tuned to achieve better performance when the axial member 134 is brought into contact with the engagement surface 115 to remove the backlash than when the backlash is not removed.

If the optical system can achieve improved performance when the axial member 134 is in contact with the engagement surface 119, the axial member 134 may be controlled to be in contact with the engagement surface 119. Here, the performance of the optical system indicates the optical performance of all or some of the optical constituents of the lens unit or lens barrel.

In the above-described driving control method, the position of the axial member 134 in the direction perpendicular to the axial direction is not considered when the driving of the axial member 132 is started in the axial direction. When problems such as friction may occur by the movement of the axial member 134 while the axial member 134 is in contact with the engagement surface 115 (or 119), the axial member 134 may be rotated before moved in the axial direction. Specifically, the axial member 134 may be first moved by using the signals from the optical sensors 221 and 222 of the position detector 117 to the position at which the axial member 134 is not in contact with the engagement surfaces 115 and 119. After this, the movement of the axial member 134 in the axial direction may be then started.

(2) Second Driving Control Method

According to the above-described first driving control method, once the axial member 132 has been moved in the axial direction to the target position in the axial direction, the movement of the axial member 132 is stopped. After this, the axial member 132 is rotated to bring the axial member 134 into contact with the engagement surface 115 to remove the backlash between the axial member 134 and the engagement surface 115.

In a second driving control method, while the axial member 132 is moved to the target position in the axial direction, the axial member 132 is repeatedly driven both in the axial direction and in the rotating direction. In other words, the axial member 132 is moved up to the target position in the axial direction while attempts are made to remove the backlash. In this way, the lens controller 250 may cause the linear actuators 120 to generate the driving force to drive the axial member in the axial direction and the driving force to rotate the axial member concurrently.

To begin with, as in the first driving control method, the lens controller 250 starts a control to drive the axial member 132 in the axial direction. In other words, the lens controller 250 instructs the driving signal generator 161 to generate a driving signal, instructs the phase difference signal controller 164 to generate a phase difference signal, and instructs the switch controller 165 to connect the switch 166 to the a side.

If the signals from the optical sensors 223 and 224 of the position detector 117 tells that the axial member 132 has moved by a predetermined distance in the axial direction, the lens controller 250 performs a control to stop the driving of the axial member 132 in the axial direction. In other words, the lens controller 250 outputs an instruction signal to the driving signal generator 161 to stop the generation of the driving signal.

After this, the lens controller 250 performs a control to rotate the axial member 132 in order to bring the axial member 134 into contact with the engagement surface 115, thereby removing the backlash, as in the first driving control method. In other words, the lens controller 250 instructs the driving signal generator 161 to generate a driving signal and instructs the switch controller 165 to connect the switch 166 to the b side. If the lens controller 250 performs a control to rotate the axial member 132 up to the position at which the axial member 134 is in contact with the engagement surface 115 by referring to the signals from the optical sensors 221 and 222 of the position detector 117, the lens controller 250 instructs the driving signal generator 161 to stop generating the driving signal to stop the rotation.

The axial member 132 is repeatedly moved in the axial direction and rotated in the above-described manner. Once the axial member 132 has moved by a certain distance in the axial direction and reached the target position, the movement of the axial member 132 in the axial direction is stopped and the axial member is rotated once for the last time to remove the backlash.

(3) Third Driving Control Method

As described above, the first and second driving control methods are designed to remove the backlash between the axial member 134 and the engagement support 114 by moving the axial member 132 in the axial direction, subsequently stopping the movement in the axial direction and then rotating the axial member 132.

Contrary to the first and second driving control methods, a third driving control method is configured to move the axial member 132 in the axial direction while removing the backlash between the axial member 134 and the engagement support 114 at the same time. As described with reference to FIG. 7, FIG. 7 (as in the first and second driving control methods described above) supposes that the phase difference between the Phase A signal and the Phase B signal is the same between the linear actuators 120.

In this case, the axial thrust forces generated by the linear actuators 120 are the same, so are the axial rotational torques. Therefore, in FIG. 13, when the switch 166 is switched to the a side, the linear actuators 120 generate equal axial thrust forces in the same direction and generate equal axial rotational torques in opposite directions. Accordingly, the axial torques cancel each other, so that the axial member 132 is not rotated and only moved in the axial direction.

However, the linear actuators 120 can generate different axial rotational torques by employing different phase differences (for example, 60° and 120°) between the Phase A signal and the Phase B signal. In this manner, the axial rotational torques are generated in opposite directions but do not cancel each other, so that the axial member 132 is rotated. In this case, the linear actuators 120 generate different axial thrust forces in the same direction, so that the axial member 132 is moved in the axial direction. Accordingly, the axial member 132 can be moved in the axial direction while being rotated.

The third driving control method is designed to perform the above-described control to move the axial member 132 in the axial direction while rotating the axial member 132 at the same time. While the axial member 132 is moved in the axial direction, the axial member 132 is concurrently rotated, so that the axial member 134 is kept pressed against the engagement surface 115. Stated differently, while the axial member 132 is moved in the axial direction, the backlash can be removed between the axial member 134 and the engagement support 114.

According to the third driving control method, the driving voltage generator 163 shown in FIG. 13 is configured to output driving voltages having different phases to the respective linear actuators. For example, the driving voltages output to the respective linear actuators may respectively have phase differences of 60° and 120° relative to the driving voltage output from the driving voltage generator 162.

The lens controller 250 starts a control to move the axial member 132 in the axial direction. Specifically speaking, the lens controller 250 instructs the driving signal generator 161 to generate a driving signal, instructs the phase difference signal controller 164 to generate a phase difference signal, and instructs the driving voltage generator 163 to operate in the above-described manner. Furthermore, the lens controller 250 instructs the switch controller 165 to connect the switch 166 to the a side.

The axial member 132 is moved in the axial direction and concurrently rotated. When the axial member 132 is rotated, the axial member 134 is biased towards the engagement surface 115. Once the axial member 134 comes into contact with the engagement surface 115, the axial member 132 is not allowed to rotate any further but keeps generating a bias force in the rotating direction.

When the signals from the optical sensors 223 and 224 of the position detector 117 tell that the axial member 132 has moved by a predetermined distance in the axial direction, the lens controller 250 performs a control to stop the movement of the axial member 132. In other words, the lens controller 250 outputs an instruction signal to prevent the driving signal generator 161 from generating a driving signal.

As described above, the movement of the axial member 132 in the axial direction is stopped. Here, since the axial member 134 was already being pressed against the engagement surface 115 while the axial member 132 was being moved, the axial member 134 is kept pressed against the engagement surface 115 after the movement of the axial member 132 is stopped. Therefore, there is no backlash between the axial member 134 and the engagement surface 115 at the moment when the movement of the axial member 132 in the axial direction is stopped.

(4) Forth Driving Control Method

According to the first, second and third driving control methods described above, no backlash is present between the axial member 134 and the engagement surface 115 at the moment when the movement of the axial member 132 in the axial direction is completed, that is to say, at the moment when the movement of the movable lens 152 in the direction of the optical axis is completed. This is because the first, second and third driving control methods suppose that the optical system is tuned to achieve high performance when no backlash is present, as described above.

In the present embodiment, however, the linear actuators 120 are driven while the position detector 117 keeps track of the position of the axial member 134. Thus, the position of the axial member 134 in the direction perpendicular to the axial direction (the Z axis direction in FIG. 1) can be controlled. Stated differently, the position of the movable lens 152 in the direction orthogonal to the optical axis J (the Z axis direction in FIG. 1) can be freely set within a movable range.

According to a fourth driving control method, during the tuning of the optical system, the position of the movable lens 152 in the direction orthogonal to the optical axis J (the Z axis direction in FIG. 1), within the movable range, which enables the optical system to achieve the best performance, is identified in association with each position of the movable lens 152 in the direction of the optical axis J. Here, the position of the axial member 134 that corresponds the identified position is stored. Such position data may be stored in the lens controller 250.

In the case where there are the movable lens 152 and the stationary lens 142 as shown in FIG. 1, the position of the movable lens 152, within the movable range, that enables the optical system to achieve the best performance is generally the position that enables the optical axes of the two lenses to match or a position in the vicinity of this position.

Although the lens unit including the driving apparatus 101 shown in FIG. 1 has only two lenses, other lenses are also provided in a lens barrel to which the lens unit is incorporated. Accordingly, the position of the movable lens 152 that enables the entire optical system including such other lenses to achieve the best performance is stored.

In the case of a magnification-variable optical system, the positions of the lenses other than the movable lens 152 are changed in the optical axis direction when the magnification is changed. Therefore, the position of the movable lens 152 in the Z direction that enables the optical system to achieve the best performance may be stored in association with each position of the movable lens 152 in the direction of the optical axis, further in association with the focal distance for each magnification.

The fourth driving control method is described in the following. The series of control operations until the axial member 132 is moved in the axial direction and then stopped are performed in the same manner as in the first driving control method. These series of control operations may be performed in the same manner as in the second and third driving control method, but may be more efficiently performed if the first driving control method is employed since it is not necessary to remove the backlash in the fourth driving control method.

After this, the lens controller 250 detects the position of the axial member 134 in the direction perpendicular to the axial direction of the axial member 134 by referring to the signals from the optical sensors 221 and 222 of the position detector 117. The lens controller 250 then reads the position in the direction perpendicular to the axial direction of the axial member that is prestored in association with the current position in the axial direction.

The lens controller 250 then performs a control to rotate the axial member 132. In particular, the lens controller 250 instructs the driving signal generator 161 to generate a driving signal and instructs the phase difference signal controller 164 to generate a phase difference signal indicative of, for example, 90° (or −90°) depending on the driving direction. The lens controller 250 also instructs the switch controller 165 to connect the switch 166 to the b side.

The above-described control causes the axial member 132 to rotate around the axis. As a result, the axial member 134 moves in the direction perpendicular to the axial direction. The lens controller 250 refers to the signals from the optical sensors 221 and 222 of the position detector 117 in order to monitor the position of the axial member 134 in the direction perpendicular to the axial direction. If the position detector 117 detects that the axial member 134 has moved to a prestored position, the lens controller 250 outputs an instruction signal to prevent the driving signal generator 161 from generating the driving signal.

If the pair of linear actuators 120 are controlled using one of the above-described four driving control methods, the movable lens 152 can be moved in the direction of the optical axis J and, at the same time, the backlash of the axial member 134 can be removed.

Figure 15:
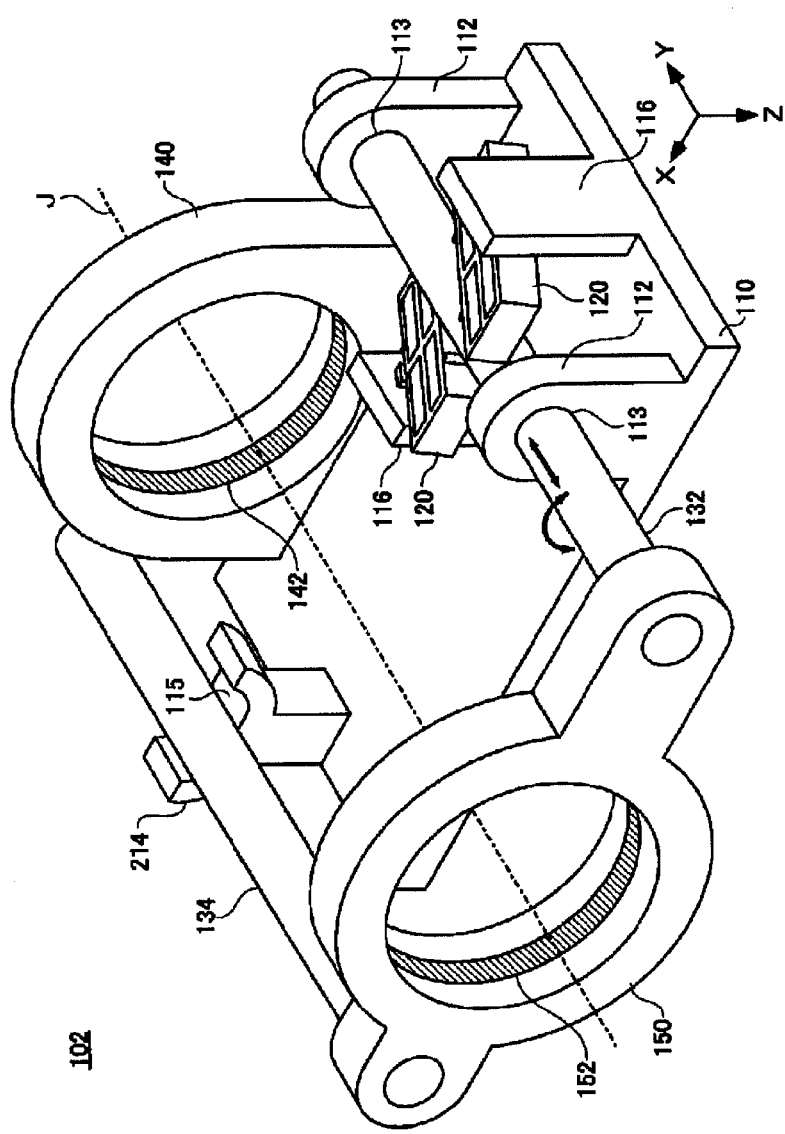
FIG. 15 illustrates a driving apparatus according to another embodiment of the present invention.

FIG. 15 illustrates a driving apparatus 102 relating to another embodiment. In FIG. 15, the same reference numerals are assigned to the constituents shared between the embodiments shown in FIGS. 1 and 15. The driving apparatus 102 relating to the present embodiment is different from the driving apparatus 101 relating to the embodiment shown in FIG. 1 in that an engagement support 214 relating to the embodiment shown in FIG. 15 is open at one end. Due to this configuration, the rotation of the axial member 132 in the clockwise direction in FIG. 15 allows the movable lens 152 to be moved away from the optical axis J using the axial member 132 as the rotation axis. This can change the characteristics of the optical system including the stationary lens 142.

The backlash of the axial member 134 can be removed since the axial member 134 can be brought into contact with the engagement surface 115 by using the first to third driving control methods, as described above in relation to the embodiment shown in FIG. 1.

Figure 16:
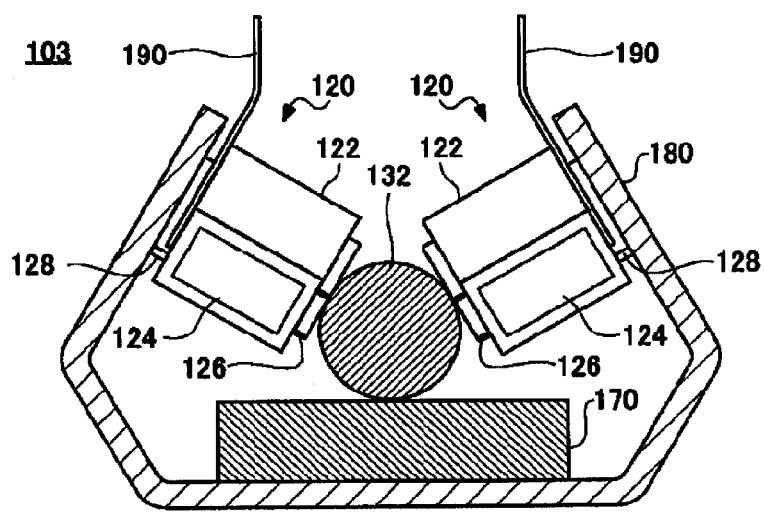
FIG. 16 is a schematic cross-sectional view illustrating a driving apparatus 103.

FIG. 16 is a schematic cross-sectional view of a driving apparatus 103. Some of the constituents of the driving apparatus 103 are the same as the corresponding constituents of the driving apparatus 101, and thus assigned with the same reference numerals and not explained here.

The driving apparatus 103 includes the axial member 132 and a mover that is configured to move relative to the axial member 132. The mover includes, in addition to the linear actuators 120, a slider 170, a bias member 180, and flexible substrates 190.

The linear actuators 120 themselves are configured in the same manner as in the driving apparatus 101. In other words, each of the linear actuators 120 includes the oscillator 122, electrodes 124, contacts 126, and pressurizing unit 128. The contacts 126 of each of the linear actuators 120 abut the axial member 132.

Here, each of the linear actuators 120 is at angle with respect to the axial direction of the axial member 132, and the linear actuators 120 are arranged at angle with respect to each other. Therefore, the contacts 126 of the linear actuators 120 oppose each other, but do not have the axial member 132 sandwiched therebetween.

In the cross-section, the lower surface of the axial member 132, which is not covered by the linear actuators 120, abuts the slider 170. The slider 170 is made of a material having a small sliding friction against the axial member 132, for example, a polyacetal resin, a fluorine resin or the like. Therefore, no large sliding friction is caused when the axial member 132 slides on the slider 170.

The bias member 180 is formed by an elastic material, encloses the linear actuators 120 and the bias member 180 therein, and presses the linear actuators 120 and the bias member 180 against the axial member 132. Thus, the axial member 132 does not escape through the linear actuators 120.

The flexible substrates 190 are coupled to the electrodes 124 of the linear actuators 120 near the pressurizing units 128. Thus, the electrodes 124 can receive the driving voltages through the flexible substrates 190. Having the above-described structure, the driving apparatus 103 has a simple structure but still can translate the axial member 132 in the axial direction and rotate the axial member 132 on the axial member 132, like the driving apparatus 101.

In the above-described example, the linear actuators 120 are arranged at angle with respect to the axial direction of the axial member 132, and the linear actuators 120 themselves are also arranged at angle with respect to each other. However, even when the linear actuators 120 oppose each other and are arranged in parallel with each other as shown in FIGS. 1 and 2, the slider 170 may be omitted and the bias member 180 may be configured to press the linear actuators 120 to the axial member 132.

Figure 17:
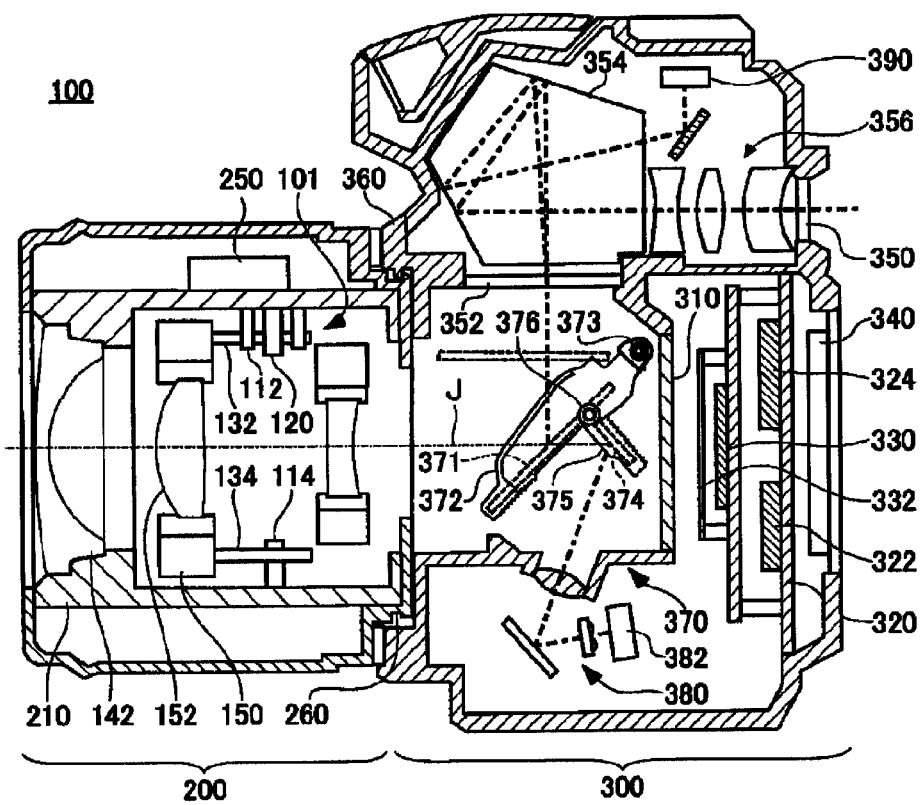
FIG. 17 is a schematic cross-sectional view illustrating a single-lens reflex camera 100.

FIG. 17 is a schematic cross-sectional view of a single-lens reflex camera 100. The single-lens reflex camera 100 includes a replaceable lens 200, which may be referred to as a lens unit, and a camera body 300.

The replaceable lens 200 includes the stationary lens 142, the movable lens 152, a fixed barrel 210, the lens controller 250, and a lens mount 260. The lens mount 260 is provided at one end of the fixed barrel 210. The lens mount 260 fits a body mount 360 of the camera body 300 to couple the replaceable lens 200 to the camera body 300.

The coupling between the lens mount 260 and the body mount 360 may be released by a special operation. Therefore, another replaceable lens 200 having a lens mount 260 of the same standard can be mounted onto the camera body 300.

The stationary lens 142 and the movable lens 152, together with other optical components, are arranged along the optical axis J within the fixed barrel 210 and thus form an optical system. The stationary lens 142 is fixed to the fixed barrel 210. The movable lens 152 moves along the optical axis J. This movement will change the focal distance or position of the optical system.

The lens controller 250 is configured to control the replaceable lens 200 and also to communicate with a body controller 322 of the camera body 300. This enables the replaceable lens 200, which is mounted onto the camera body 300, to coordinate with the camera body 300.

In the replaceable lens 200, the movable lens 152 is supported by the movable lens holder frame 150. The movable lens holder frame 150 is fixed onto the ends of the axial members 132 and 134 forming a pair. The axial member 132 is inserted into the pair of fitting supports 112 provided on the fixed barrel 210 and is supported in such a manner that the axial member 132 can slide in the direction parallel to the optical axis J.

The axial member 132 is driven by the pair of linear actuators 120 arranged between the fitting supports 112. The other axial member 134 abuts the engagement support 114 formed on the fixed barrel 210. In this manner, the driving apparatus 101 is formed in the replaceable lens 200.

In the above-described replaceable lens 200, the optical system is focused or changes the magnification by the translation of the axial member 132 in the direction parallel to the optical axis J that is caused by the driving apparatus 101. Also, in the replaceable lens 200, the driving apparatus 101 rotates the axial member 132 to press the axial member 134 against the engagement surface 115 or 115b of the engagement support 114. This removes the backlash between the axial members 132 and 134 and the fixed barrel 210 and can accurately position the movable lens 152 on the optical axis J.

In the camera body 300, a mirror unit 370 is arranged opposite the replaceable lens 200 with respect to the body mount 360. Above the mirror unit 370, a focusing screen 352 is horizontally arranged.

A pentaprism 354 is arranged above the focusing screen 352, and a finder optical system 356 is arranged behind the pentaprism 354. The back end of the finder optical system 356 is externally exposed as a finder 350 on the back surface of the camera body 300.

In the camera body 300, behind the mirror unit 370, a focal plane shutter 310, an optical filter 332, and an imaging element 330 are arranged in the stated order. The focal plane shutter 310 opens or closes to allow or prevent object luminous flux to enter/from being entering the imaging element 330.

The optical filter 332 is arranged immediately in front of the imaging element 330 and is configured to remove infrared and ultraviolet rays from the object luminous flux that is to enter the imaging element 330. The optical filter 332 also serves to protect the surface of the imaging element 330.

Furthermore, the optical filter 332 acts as a low pass filter to reduce the spatial frequency of the object luminous flux. This can reduce occurrence of moire when the object luminous flux containing spatial frequencies exceeding the Nyquist frequency of the imaging element 330 enters the imaging element 330.

The imaging element 330, which is arranged behind the optical filter 332, is formed by a photoelectric converter such as a CCD sensor and a CMOS sensor. Behind the imaging element 330, a main substrate 320 and a back display 340 are arranged in the stated order. On the main substrate 320, the body controller 322, an image processing unit 324 and the like are mounted. The back display 340 is formed by a liquid crystal display plate and the like and externally exposed on the back surface of the camera body 300.

The mirror unit 370 includes a main mirror holder frame 372 and a main mirror 371. The main mirror holder frame 372 holds the main mirror 371 while being axially supported by a main mirror rotation axis 373.

The mirror unit 370 also includes a sub-mirror holder frame 375 and a sub-mirror 374. The sub-mirror holder frame 375 holds the sub-mirror 374 while being axially supported by the main mirror holder frame 372 by means of the sub-mirror rotation axis 376.

In this way, the sub-mirror 374 can rotate with respect to the main mirror holder frame 372. When the main mirror holder frame 372 rotates, the sub-mirror 374 and the sub-mirror holder frame 375 move together with the main mirror holder frame 372 while rotating with respect to the main mirror holder frame 372.

In the mirror unit 370 shown in FIG. 17, when lowered, the main mirror 371 is positioned at an observation position so as to cross at angle the optical axis J of the object luminous flux. When the main mirror 371 is at the observation position, the object luminous flux entering the main mirror 371 partially enters the sub-mirror 374 after transmitting through the half mirror region formed in part of the main mirror 371. The object luminous flux that enters the sub-mirror 374 is partially reflected towards a focus optical system 380 to finally enter a focus position sensor 382.

The focus position sensor 382 detects the defocus amount of the optical system of the replaceable lens 200 and notifies the body controller 322 of the defocus amount. The body controller 322 communicates with the lens controller 250 to move the movable lens 152 and the like in a manner to cancel the detected defocus amount. In this manner, the replaceable lens 200 is focused to form an image of the object on the surface of the imaging element 330 on which the elements are arranged.

When at the observation position, the main mirror 371 reflects most of the object luminous flux towards the focusing screen 352. The focusing screen 352 is at an optically conjugate position with respect to the surface of the imaging element 330 on which the elements are arranged, and visualizes the image of the object formed by the optical system of the replaceable lens 200.

The image of the object formed on the focusing screen 352 is observed via the finder 350 through the pentaprism 354 and the finder optical system 356. The image of the object through the pentaprism 354 is observed as an erected image via the finder 350.

The object luminous flux emitted from the pentaprism 354 is partially received by an optical sensor 390 arranged above the finder optical system 356. When the release button of the camera body 300 is pressed halfway, the optical sensor 390 detects the luminance of the object based on part of the incident luminous flux it has received.

The body controller 322 calculates imaging conditions such as the aperture, the shutter speed, the ISO speed and the like, according to the detected luminance of the object. In this manner, the single-lens reflex camera 100 can be ready to image the object under appropriate imaging conditions.

When the release button of the single-lens reflex camera 100 is pressed, the main mirror holder frame 372 rotates clockwise in FIG. 17 together with the main mirror 371, and comes to rest and lies substantially horizontally at the retreated position. This moves the main mirror 371 away from the optical path of the object luminous flux that enters through the optical system of the replaceable lens 200.

When the main mirror 371 rotates towards the imaging position, the sub-mirror holder frame 375 also moves upward together with the main mirror holder frame 372, rotates around the sub-mirror rotation axis 376, come to rest and lie substantially horizontally at the imaging position. In this way, the sub-mirror 374 is also moved away from the optical path of the object luminous flux.

Once the main mirror 371 and the sub-mirror 374 have moved to the imaging position, the focal plane shutter 310 subsequently opens in the camera body 300. This allows the incident luminous flux that enters the camera body 300 through the optical system of the replaceable lens 200 to be received by the imaging element 330 through the optical filter 332. Once the imaging is completed, the back shutter curtain of the focal plane shutter 310 is closed, and the main mirror 371 and the sub-mirror 374 return to the observation position. This is a cycle of imaging operations.

In the above, the replaceable lens 200 of the single-lens reflex camera 100 has been described as an example. The driving apparatus 101, however, can be used to move an optical component in the lens unit in a variety of imaging apparatuses such as a mirrorless camera, a compact camera, a video camera and the like. Furthermore, the use of the driving apparatus 101 is not limited to an imaging apparatus, and the driving apparatus 101 can be widely used to translate a component that is highly accurately positioned, for example, used in an optical device such as a microscope provided with an optical component.

While the embodiments of the present invention have been described, the technical scope of the invention is not limited to the above described embodiments. It is apparent to persons skilled in the art that various alterations and improvements can be added to the above-described embodiment(s). It is also apparent from the scope of the claims that the embodiments added with such alterations or improvements can be included in the technical scope of the invention.

DESCRIPTION OF REFERENCE NUMERALS

100 single-lens reflex camera, 101, 102, 103 driving apparatus, 110 base, 112 fitting support, 113 fitting hole, 114, 214 engagement support, 115, 119 engagement surface, 116 liner actuator support, 117 position detector, 118 slit member, 120 linear actuator, 122 oscillator, 124 electrode, 126 contact, 128 pressurizing unit, 132, 134 axial member, 140 stationary lens holder frame, 142 stationary lens, 150 movable lens holder frame, 152 movable lens, 160 driving controller, 161 driving signal generator, 162, 163 driving voltage generator, 164 phase difference signal controller, 165 switch controller, 166 switch, 170 slider, 180 bias member, 190 flexible substrate, 200 replaceable lens, 210 fixed barrel, 221, 222, 223, 224 optical sensor, 225 light emitter, 232, 234 slit, 250 lens controller, 260 lens mount, 300 camera body, 310 focal plane shutter, 320 substrate, 322 body controller, 324 image processing unit, 330 imaging element, 332 optical filter, 340 display, 350 finder, 352 focusing screen, 354 pentaprism, 356 finder optical system, 360 body mount, 370 mirror unit, 371 main mirror, 372 main mirror holder frame, 373 main mirror rotation axis, 374 sub-mirror, 375 sub-mirror holder frame, 376 sub-mirror rotation axis, 380 focus optical system, 382 focus position sensor, 390 optical sensor

What is claimed is:

1. A driving apparatus comprising:
a holder member that holds a first lens;
a first axial member that is connected to the holder member, and that is arranged so as to extend along an optical axis of the first lens;
a support that supports the first axial member in such a manner that the first axial member is movable along the optical axis of the first lens, and has a contact surface that can be brought into contact with the first axial member;
a second axial member that is connected to the holder at a different position than the first axial member, and that is arranged so as to extend along the optical axis; and
a driving section that is arranged in such a manner that at least one part of the driving section contacts the second axial member, and performs a first driving that moves the second axial member along the optical axis and a second driving that moves the second axial member in a direction intersecting the optical axis to a position that allows the first axial member to contact the contact surface.

2. The driving apparatus as set forth in claim 1, wherein the driving section performs the second driving after performing the first driving.

3. The driving apparatus as set forth in claim 1, wherein the driving section performs the second driving while performing the first driving.

4. The driving apparatus as set forth in claim 1, wherein the driving section generates a first driving force for performing the first driving, the first driving force applied to the second axial member and a second driving force for performing the second driving, the second driving force applied to the second axial member.

5. The driving apparatus as set forth in claim 4, wherein the driving section generates a third driving force for generating the first driving force and the second driving force, the third driving force applied to the second axial member at an angle with respect to the optical axis.

6. The driving apparatus as set forth in claim 4, wherein the second driving force is used to rotate the second axial member about an axis of the second axial member.

7. The driving apparatus as set forth in claim 1, wherein the driving section includes:
a first driving section that is configured to generate a driving force at a first angle with respect to the optical axis, the driving force applied to the second axial member; and
a second driving section that is positioned differently from the first driving section in a circumferential direction of the second axial member, the second driving section being configured to generate a driving force at a second angle with respect to the optical axis, the driving force applied to the second axial member.

8. The driving apparatus as set forth in claim 7, wherein the first angle is parallel to the second angle.

9. An optical apparatus, comprising:
the driving apparatus as set forth in claim 1; and
a second lens that is different from the first lens, the second lens positioned along the optical axis.

10. The optical apparatus as set forth in claim 9, wherein the first driving is used to focus an optical system including the first lens and the second lens or to change a magnification of the optical system.

11. The optical apparatus as set forth in claim 9, further comprising
a detector that is configured to detect a position of the first axial member along an axis intersecting the optical axis;
wherein the driving section moves the first axial member to a predetermined position along the axis intersecting the optical axis by the second driving based on a result of the detection performed by the detector.

12. The optical apparatus as set forth in claim 11, wherein the predetermined position is determined in advance according to a position of the first axial member along the optical axis.

13. The optical apparatus as set forth in claim 9, wherein the second driving is used to move the holder member away from an optical path formed by the second lens.

14. An imaging apparatus comprising:
the optical apparatus as set forth in claim 9; and
an imaging unit that is configured to image light entering the imaging apparatus through the optical apparatus.

15. The driving apparatus as set forth in claim 1, wherein the first axial member is substantially symmetrically positioned to the second axial member with respect to the optical axis.

16. A driving method comprising:
holding a first lens with a holder member including a first axial member and a second axial member, the first axial member connected to the holder member and arranged so as to extend along an optical axis of the first lens, the second axial member connected to the holder member at a different position than the first axial member and arranged so as to extend along the optical axis;
supporting, by a support, the first axial member in such a manner that the first axial member is movable along the optical axis of the first lens, the support having a contact surface that can be brought into contact with the first axial member; and
performing, by a driving section that is arranged in such a manner that at least one part of the driving section contacts the second axial member, a first driving that moves the second axial member along the optical axis and a second driving that moves the second axial member in a direction intersecting the optical axis to a position that allows the first axial member to contact the contact surface.

17. The driving method as set forth in claim 16, wherein the second driving is performed after performing the first driving.

18. The driving method as set forth in claim 16, wherein the first driving and the second driving are performed concurrently.

19. The driving method as set forth in claim 16, further comprising
generating and applying a first driving force for performing the first driving to the second axial member, and a second driving force for performing the second driving to the second axial member.

20. The driving method as set forth in claim 19, further comprising
generating and applying a third driving force, the third driving force for generating the first driving force and the second driving force, to the second axial member at an angle with respect to the optical axis.

21. The driving method as set forth in claim 19, wherein the second driving force is used to rotate the second axial member about an axis of the second axial member.

22. The driving method as set forth in claim 16, further comprising
generating, by a first driving section, a driving force at a first angle with respect to the optical axis, the driving force applied to the second axial member; and
generating, by a second driving section that is positioned differently from the first driving section in a circumferential direction of the second axial member, a driving force at a second angle with respect to the optical axis, the driving force applied to the second axial member.

23. The driving method as set forth in claim 22, wherein the first angle is parallel to the second angle.

24. A method of an optical apparatus, comprising
the driving method as set forth in claim 16;
wherein the first driving is used to focus an optical system including the first lens and a second lens that is different from the first lens, or to change a magnification of the optical system.

25. A method of an optical apparatus, comprising
the driving method as set forth in claim 16;
detecting a position of the first axial member along an axis intersecting the optical axis; and
moving the first axial member to a predetermined position along the axis intersecting the optical axis by the second driving based on a result of the detecting.

26. The method as set forth in claim 25, further comprising
determining the predetermined position in advance according to a position of the first axial member along the optical axis.

27. A method of an optical apparatus, comprising
the driving method as set forth in claim 16;
wherein the second driving is used to move the holder member away from an optical path formed by a second lens that is different from the first lens.

28. A method of an imaging apparatus comprising:
the method of the optical apparatus as set forth in claim 16; and
imaging light entering the imaging apparatus through the optical apparatus;
wherein the optical apparatus comprises a second lens that is different from the first lens.

29. The driving method as set forth in claim 16, wherein the first axial member is substantially symmetrically positioned to the second axial member with respect to the optical axis.

* * * * *